United States Patent [19]
Concorso

[11] Patent Number: 6,023,841
[45] Date of Patent: Feb. 15, 2000

[54] PRINTED CIRCUIT BOARD FIXING AND MOUNTING PROCEDURE FOR POWER DEVICES

[76] Inventor: James A. Concorso, 1007 Rector Rd., Bridgewater, N.J. 08807-1317

[21] Appl. No.: 09/072,723

[22] Filed: May 6, 1998

[51] Int. Cl.[7] ....................................................... H05K 3/34
[52] U.S. Cl. ................................ 29/840; 29/832; 29/830; 29/412; 29/413
[58] Field of Search ............................. 29/840, 832, 413, 29/412, 830

[56] References Cited

U.S. PATENT DOCUMENTS

| | | | |
|---|---|---|---|
| 3,852,870 | 12/1974 | Elliot | 29/413 |
| 4,243,495 | 1/1981 | Trott | 29/413 |
| 4,328,613 | 5/1982 | Kirkpatrick | 29/837 |
| 4,673,772 | 6/1987 | Satoh et al. | 29/840 |
| 4,841,630 | 6/1989 | Lubranski et al. | 29/832 |
| 5,093,282 | 3/1992 | Ohno et al. | 29/832 |
| 5,386,338 | 1/1995 | Jordan et al. | 174/16.3 |

*Primary Examiner*—Lee Young
*Assistant Examiner*—Sean Smith

[57] ABSTRACT

The present invention relates to a manufacturing procedure for printed circuit boards. It is directed to those printed circuit boards which utilize one or more power devices. There is a printed circuit board having one or more removable regions, each removably joined thereto by means of a boundary which is perforated, scored, formed with a reduced material thickness, or otherwise rendered into a breakaway region. Each removable or breakaway region has one or more fixturing holes. There is a temporary fastener and a mating fastener for each of said fixturing holes, one or more power devices, and at least one heat sink having a mounting hole for each of said fixturing holes. The position of each mounting hole on said heat sink is related to the position of a corresponding fixturing hole on a removable region of said printed circuit board. Thus, when a power device is affixed to a removable region, the mounting hole of said power device will align with the respective mounting hole of the heat sink. Upon completion of relevant board processing, the temporary fastener or fasteners and the mating fastener or fasteners are removed and said removable region or regions are separated from the printed circuit board by means of fracture, with the power device or devices remaining attached to the board, whereupon a permanent fastener affixes each power device to said heat sink by engaging the respective mounting hole.

20 Claims, 13 Drawing Sheets

Figure 13

PRINTED CIRCUIT BOARD FIXING AND MOUNTING PROCEDURE FOR POWER DEVICES

BACKGROUND OF THE INVENTION

1. Field of the Invention

The present invention relates to a manufacturing procedure for printed circuit boards. It is directed to those printed circuit boards which utilize one or more power devices.

2. Information Disclosure Statement

"Power devices" as used herein means semiconductors or resistors which dissipate significant amounts of heat and require assembly to a heat sink. These power devices have at least one mounting hole for attachment to a heat sink and two or more electrical leads for connection to a printed circuit board. When the heat sink is small in size, it is typically affixed to the printed circuit board with wave-solderable mechanical support pins. However, high-power devices require a heat sink that is usually too large to fit on a printed circuit board; said heat sink is usually a chassis-mounted component or is part of the chassis itself. In these instances, the printed circuit board must be so configured as to allow its attendant power devices to thermally interface (either directly, or, indirectly with a conducting device such as a heat pipe) with the off-board heat sink. During assembly, steps must be taken to assure that the electrical leads of the power devices align with the printed circuit board, while at the same time the mounting holes of the power devices align with the heat sink. Typically, the power devices are omitted when the printed circuit board is populated, wave-soldered, and washed. Subsequently, the power devices are loosely attached to the heat sink by means of mounting screws. This is followed by hand-fitting and hand-soldering the printed circuit board to the electrical leads of the power devices. Once the proper fit is established among the printed circuit board, the power devices, and the heat sink, the mounting screws are tightened.

The problem with the above-described assembly method is that automation cannot be used to solder and wash the electrical connections of the power devices, since the invariably bulky heat sink cannot be supported as the printed circuit board passes through the wave-solder machine and the board-washing machine. Hand soldering produces relatively inconsistent results, costs more, takes longer, and introduces human error. Also, the increased handling of the power devices places them at risk of being damaged by electrostatic discharge. In addition to the aforesaid reliability issue, this introduces the need for static dissipative tools, materials, clothing, and training; each of which represents an additional manufacturing expense. Further, the hand-soldered connections must either be left dirty, or manually cleaned with a spray product that could damage the finish of nearby painted or powder-coated surfaces or contaminate other chassis components with the flux residue rinsed from the connections. Thus, the present invention is directed to overcoming these prior art shortcomings.

SUMMARY OF THE INVENTION

The present invention relates to a manufacturing procedure for printed circuit boards. It is directed to those printed circuit boards which utilize one or more power devices. There is a printed circuit board having one or more removable regions, each removably joined thereto by means of a boundary which has reduced material strength relative to that of areas adjacent to said boundary, i.e., is perforated, scored, formed with a reduced material thickness, or otherwise rendered into a breakaway region. Each removable or breakaway region has one or more fixturing holes. There is a temporary fastener and a mating fastener for each of said fixturing holes, one or more power devices, and at least one heat sink having a mounting hole for each of said fixturing holes. The position of each mounting hole on said heat sink is related to the position of a corresponding fixturing hole on a removable region of said printed circuit board. Thus, when a power device is affixed to a removable region, the mounting hole of said power device will align with the respective mounting hole of the heat sink. Upon completion of relevant board processing, the temporary fastener or fasteners and the mating fastener or fasteners are removed and said removable region or regions are separated from the printed circuit board by means of fracture, with the power device or devices remaining attached to the board, whereupon a permanent fastener affixes each power device to said heat sink by engaging the respective mounting hole.

BRIEF DESCRIPTION OF THE DRAWINGS

The present invention as described in the specification herein is more fully understood when taken in conjunction with the drawings appended hereto.

Thus.

DETAILED DESCRIPTION OF THE PRESENT INVENTION

The present invention relates to a manufacturing procedure for printed circuit boards. It is directed to those printed circuit boards which utilize one or more power devices.

Figure 1:
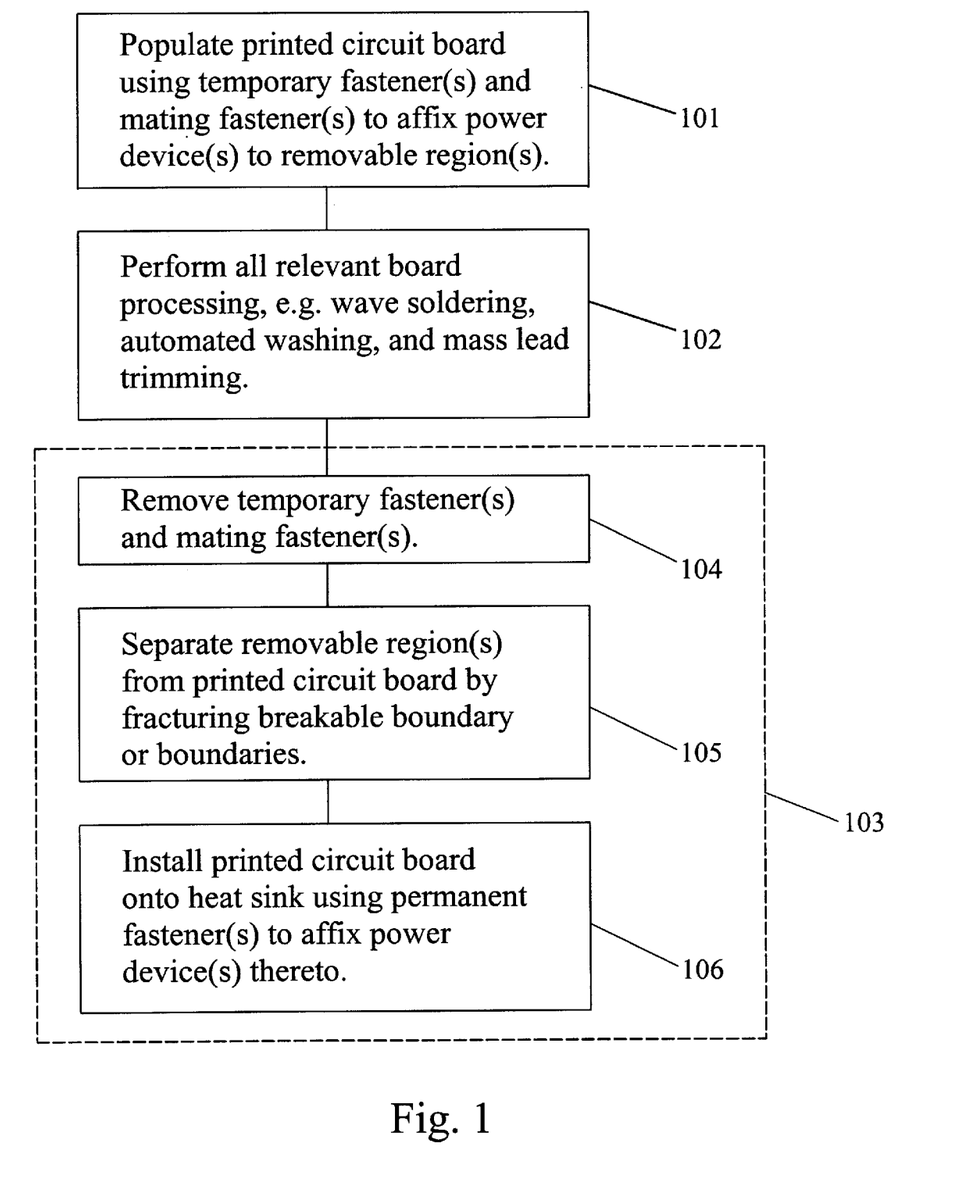
FIG. 1 shows a flow diagram of a manufacturing procedure of the present invention.

Referring to the flow diagram of FIG. 1, a manufacturing procedure of the present invention comprises preassembly step 101 as follows:

Populate printed circuit board using temporary fastener(s) and mating fastener(s) to affix power device(s) to removable region(s).

The manufacturing procedure of FIG. 1 further includes board processing step 102 as follows:

Perform all relevant board processing, e.g., wave soldering, automated washing, and mass lead trimming.

The manufacturing procedure of FIG. 1 also includes final assembly procedure 103 as follows:

Step 104: Remove temporary fastener(s) and mating fastener(s).

Step 105: Separate removable region(s) from printed circuit board by fracturing breakable boundary or boundaries.

Step 106: Install printed circuit board onto heat sink, using permanent fastener(s) to affix power device(s) thereto.

Figure 2:
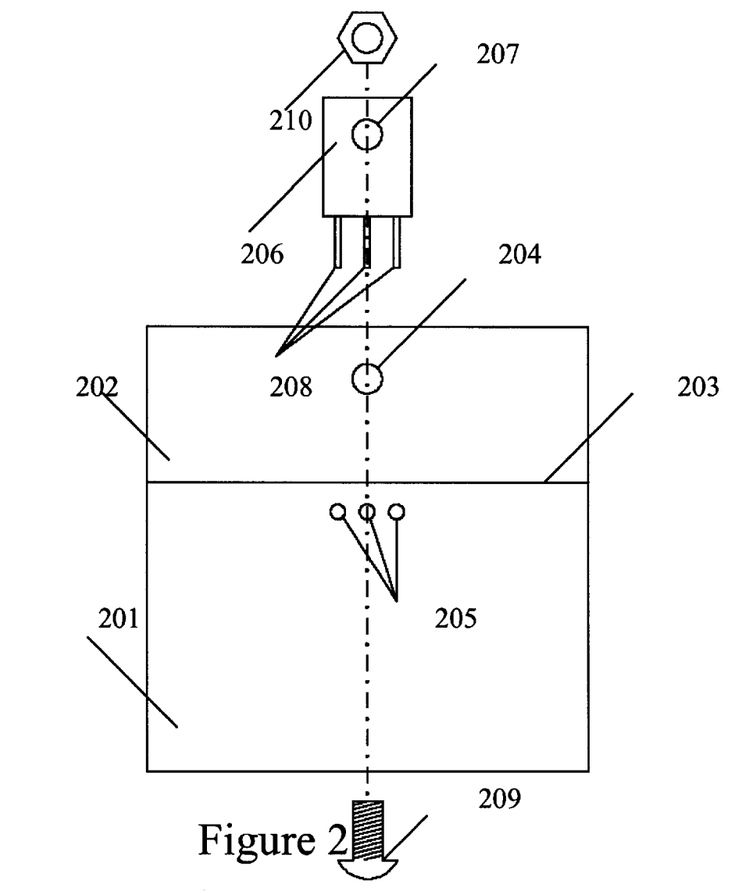
FIG. 2 shows a preassembly pictorial diagram of the present invention wherein the printed circuit board has a removable side region.

Referring to the preassembly pictorial diagram of FIG. 2, the present invention comprises a printed circuit board 201 having a removable side region 202 which is removably joined thereto by means of breakable boundary 203. There is a fixturing hole 204 located on removable side region 202 which accommodates temporary fastener 209. Power device 206 has mounting hole 207 and electrical leads 208. Temporary fastener 209 is placed in fixturing hole 204 and mounting hole 207 and engages mating fastener 210. Electrical holes 205 of printed circuit board 201 accommodate electrical leads 208 of power device 206.

Figure 3:
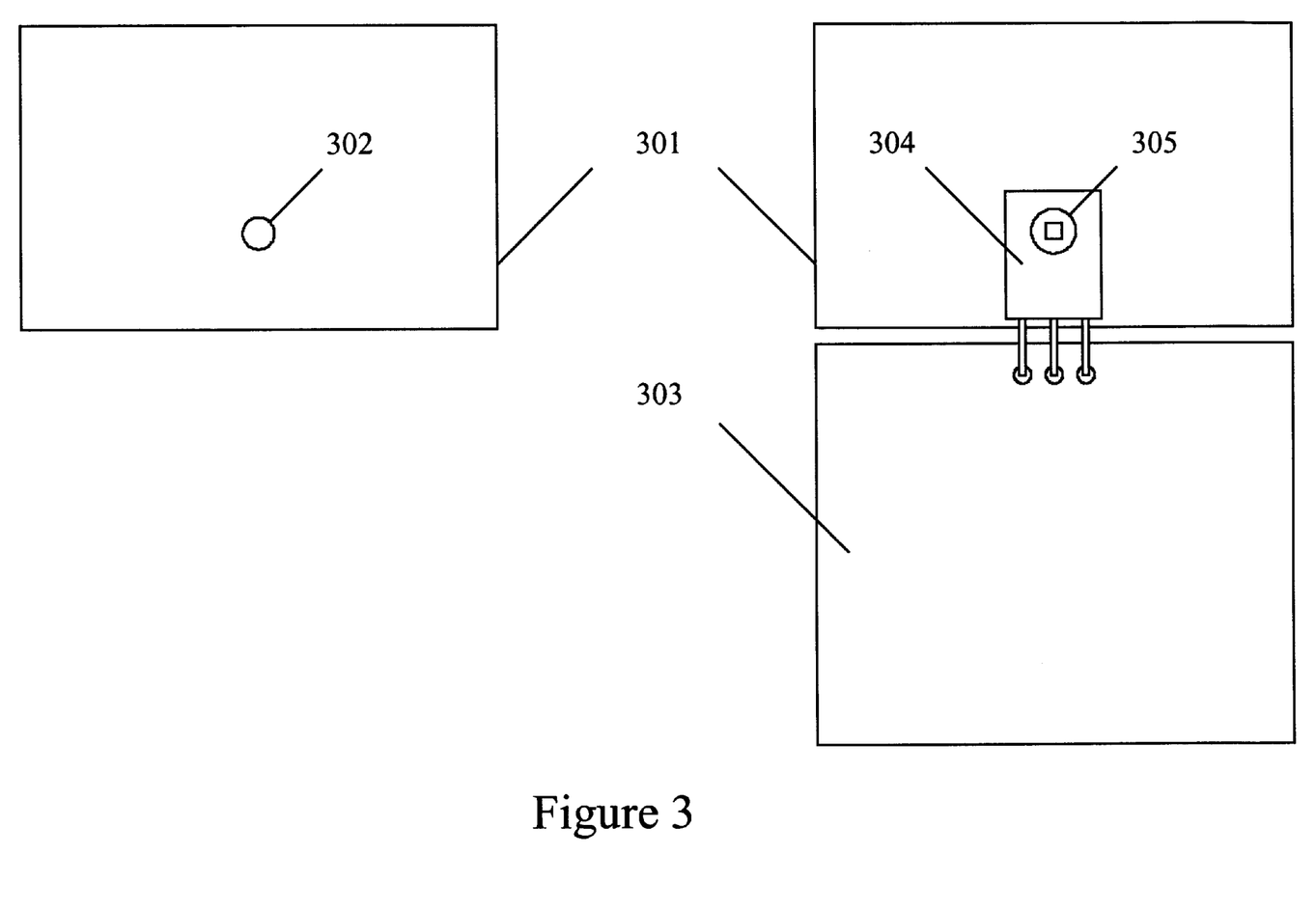
FIG. 3 shows a final assembly pictorial diagram of the present invention which corresponds to the preassembly pictorial diagram of FIG. 2.

Referring to the final assembly pictorial diagram of FIG. 3, heat sink 301 has mounting hole 302 to engage permanent fastener 305. The positioning of mounting hole 302 on heat sink 301 is related to the positioning of fixturing hole 204 on removable side region 202 of FIG. 2. Printed circuit board 201 and power device 206 of FIG. 2 have been assembled as set forth in the flow diagram of FIG. 1, and are now assembled printed circuit board 303 and power device 304 of FIG. 3, respectively. Permanent fastener 305 affixes power device 304 of assembled printed circuit board 303 to heat sink 301 by engaging mounting hole 302.

Elevations and recessions are not used on the heat sink of FIG. 3. If it is desired to better center the power device(s) on a large heat sink, a recessed surface is preferred on same as depicted in FIG. 4, otherwise the power devices cannot have direct contact with the heat sink due to the inherent thickness of the board, or the power devices would have to be hand-mounted upside down from the rest of the board components.

Figure 4:
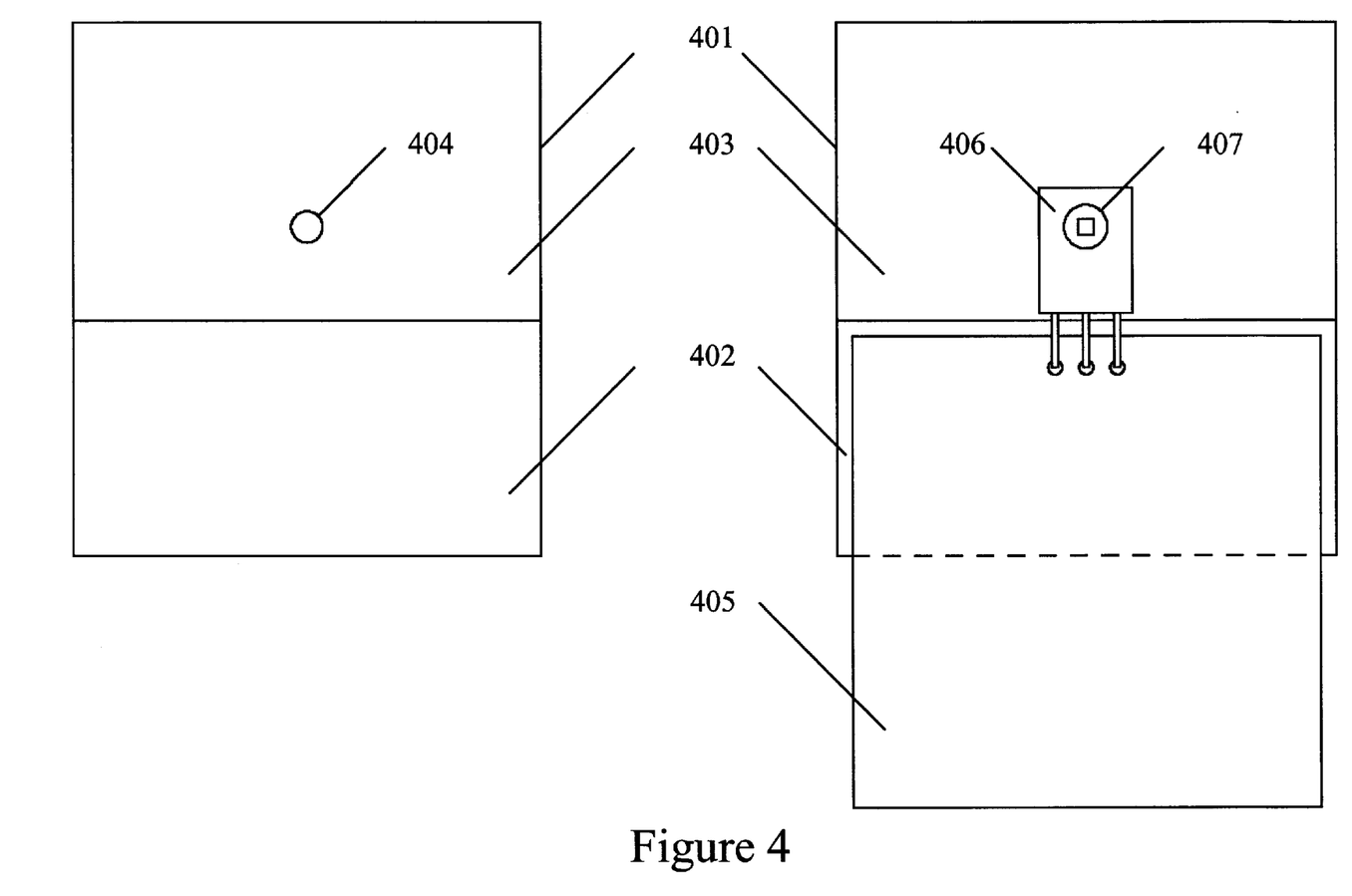
FIG. 4 shows a final assembly pictorial diagram of the present invention which corresponds to the preassembly pictorial diagram of FIG. 2 wherein the heat sink has a recessed surface.

Referring now to the final assembly pictorial diagram of FIG. 4, heat sink 401 has recessed surface 402, elevated surface 403, and mounting hole 404 located on elevated surface 403 to engage permanent fastener 407. The positioning of mounting hole 404 on elevated surface 403 is related to the positioning of fixturing hole 204 on removable side region 202 of FIG. 2. Printed circuit board 201 and power device 206 of FIG. 2 have been assembled as set forth in the flow diagram of FIG. 1, and are now assembled printed circuit board 405 and power device 406 of FIG. 4, respectively. Permanent fastener 407 affixes power device 406 of assembled printed circuit board 405 to elevated surface 403 of heat sink 401 by engaging mounting hole 404, and, recessed surface 402 of heat sink 401 accommodates assembled printed circuit board 405 by affording mechanical clearance to same.

It is not always practical to remove an entire side of a printed circuit board; this would require that no circuitry resides to the left or to the right of the power device(s). Thus, in FIG. 5, a printed circuit board of the present invention has a removable corner region. If circuitry must be placed to the right of the power device(s), the removable region is located in a left-hand corner as shown. The arrangement is simply reversed for boards having circuitry to the left of the power device(s), and the removable region is located on a right-hand corner.

Figure 5:
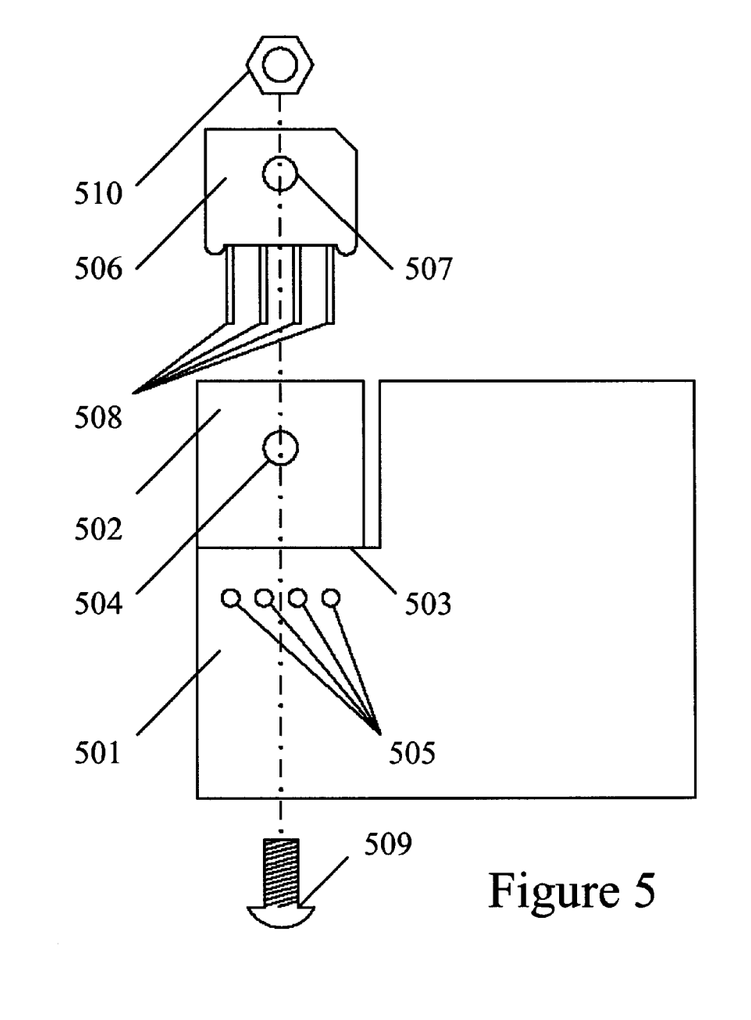
FIG. 5 shows a preassembly pictorial diagram of the present invention wherein the printed circuit board has a removable corner region.

Referring to the preassembly pictorial diagram of FIG. 5, the present invention comprises a printed circuit board 501 having a removable corner region 502 which is removably joined thereto by means of breakable boundary 503. There is a fixturing hole 504 located on removable corner region 502 which accommodates temporary fastener 509. Power device 506 has mounting hole 507 and electrical leads 508. Temporary fastener 509 is placed in fixturing hole 504 and mounting hole 507 and engages mating fastener 510. Electrical holes 505 of printed circuit board 501 accommodate electrical leads 508 of power device 506.

Figure 6:
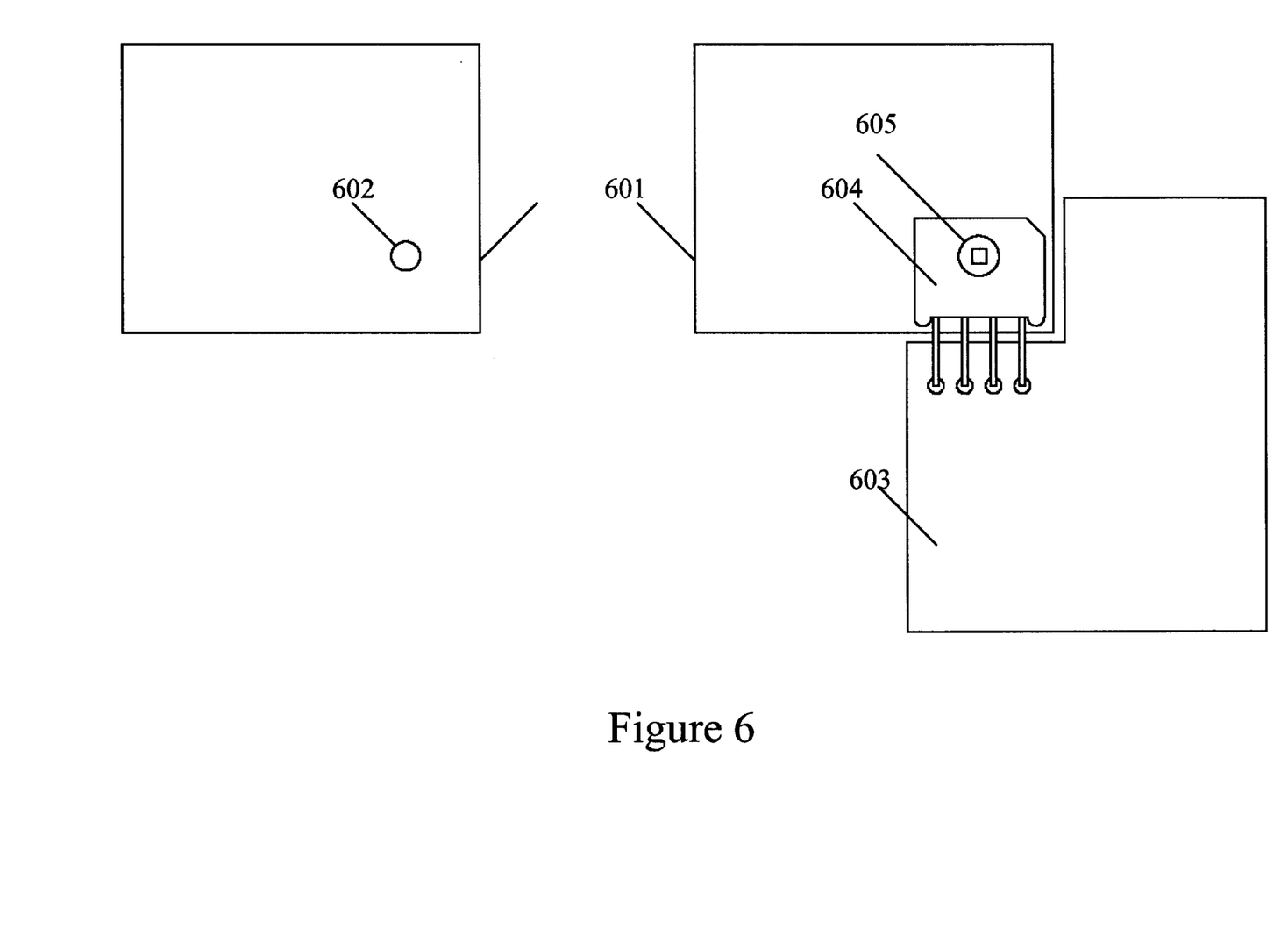
FIG. 6 shows a final assembly pictorial diagram of the present invention which corresponds to the preassembly pictorial diagram of FIG. 5.

Referring to the final assembly pictorial diagram of FIG. 6, heat sink 601 has mounting hole 602 to engage permanent fastener 605. The positioning of mounting hole 602 on heat sink 601 is related to the positioning of fixturing hole 504 on removable corner region 502 of FIG. 5. Printed circuit board 501 and power device 506 of FIG. 5 have been assembled as set forth in the flow diagram of FIG. 1, and are now assembled printed circuit board 603 and power device 604 of FIG. 6, respectively. Permanent fastener 605 affixes power device 604 of assembled printed circuit board 603 to heat sink 601 by engaging mounting hole 602.

Elevations and recessions are not used on the heat sink of FIG. 6. If it is desired to better center the power device(s) on a large heat sink, a recessed surface is preferred on same as depicted in FIG. 7, otherwise the power devices cannot have direct contact with the heat sink due to the inherent thickness of the board, or the power devices would have to be hand-mounted upside down from the rest of the board components.

Figure 7:
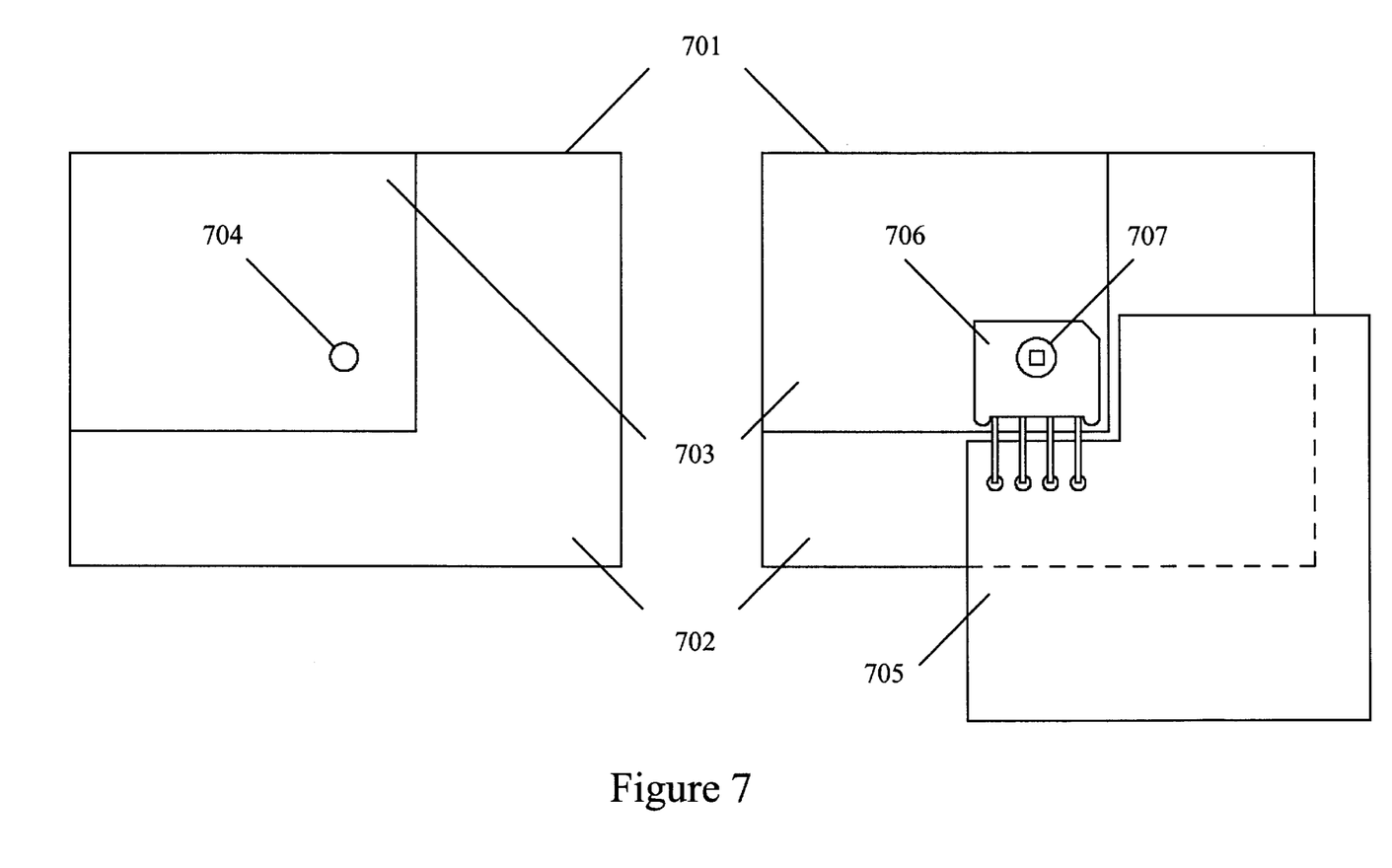
FIG. 7 shows a final assembly pictorial diagram of the present invention which corresponds to the preassembly pictorial diagram of FIG. 5 wherein the heat sink has a recessed surface.

Referring now to the final assembly pictorial diagram of FIG. 7, heat sink 701 has recessed surface 702, elevated surface 703, and mounting hole 704 located on elevated surface 703 to engage permanent fastener 707. The positioning of mounting hole 704 on elevated surface 703 is related to the positioning of fixturing hole 504 on removable corner region 502 of FIG. 5. Printed circuit board 501 and power device 506 of FIG. 5 have been assembled as set forth in the flow diagram of FIG. 1, and are now assembled printed circuit board 705 and power device 706 of FIG. 7, respectively. Permanent fastener 707 affixes power device 706 of assembled printed circuit board 705 to elevated surface 703 of heat sink 701 by engaging mounting hole 704, and, recessed surface 702 of heat sink 701 accommodates assembled printed circuit board 705 by affording mechanical clearance to same.

Sometimes circuitry must be located both to the left and to the right of the power device(s). Thus in FIG. 8, a printed circuit board of the present invention has a removable tab region located between two corners of its perimeter.

Figure 8:
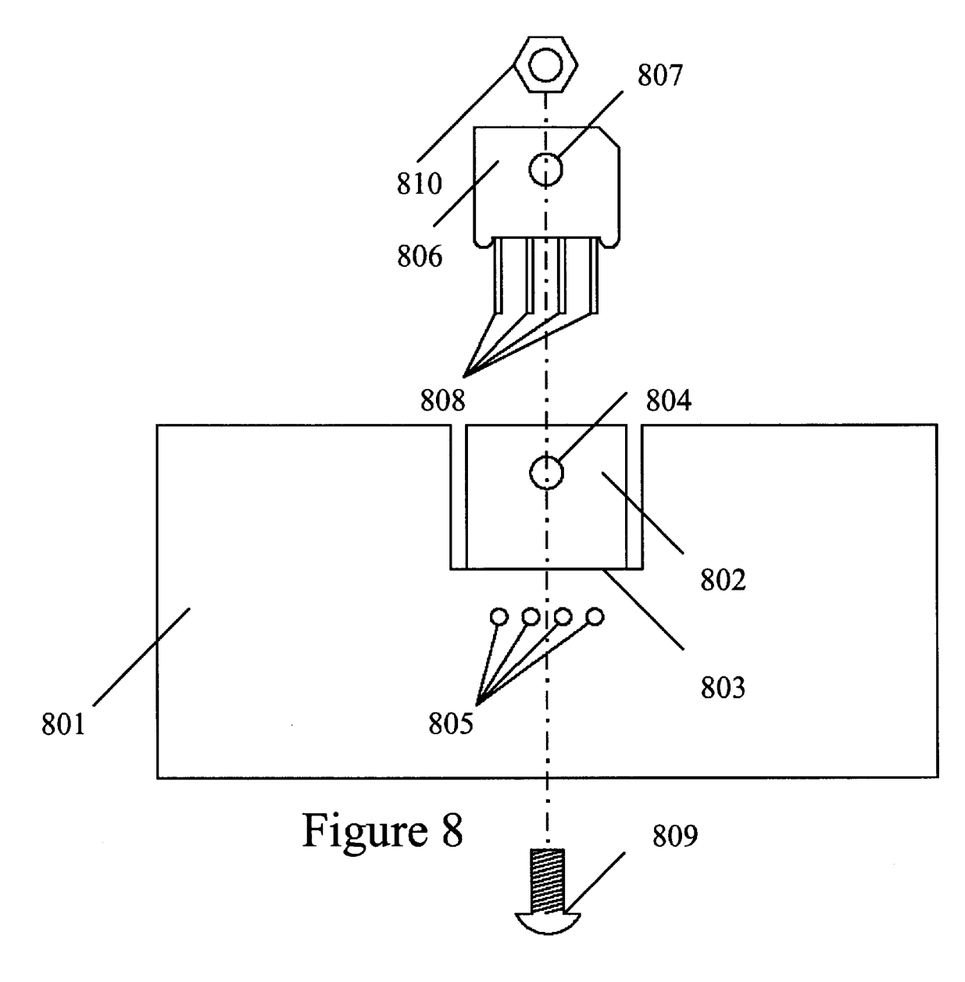
FIG. 8 shows a preassembly pictorial diagram of the present invention wherein the printed circuit board has a removable tab region.

Referring to the preassembly pictorial diagram of FIG. 8, the present invention comprises a printed circuit board 801 having a removable tab region 802 which is removably joined thereto by means of breakable boundary 803. There is a fixturing hole 804 located on removable tab region 802 which accommodates temporary fastener 809. Power device 806 has mounting hole 807 and electrical leads 808. Temporary fastener 809 is placed in fixturing hole 804 and mounting hole 807 and engages mating fastener 810. Electrical holes 805 of printed circuit board 801 accommodate electrical leads 808 of power device 806.

Figure 9:
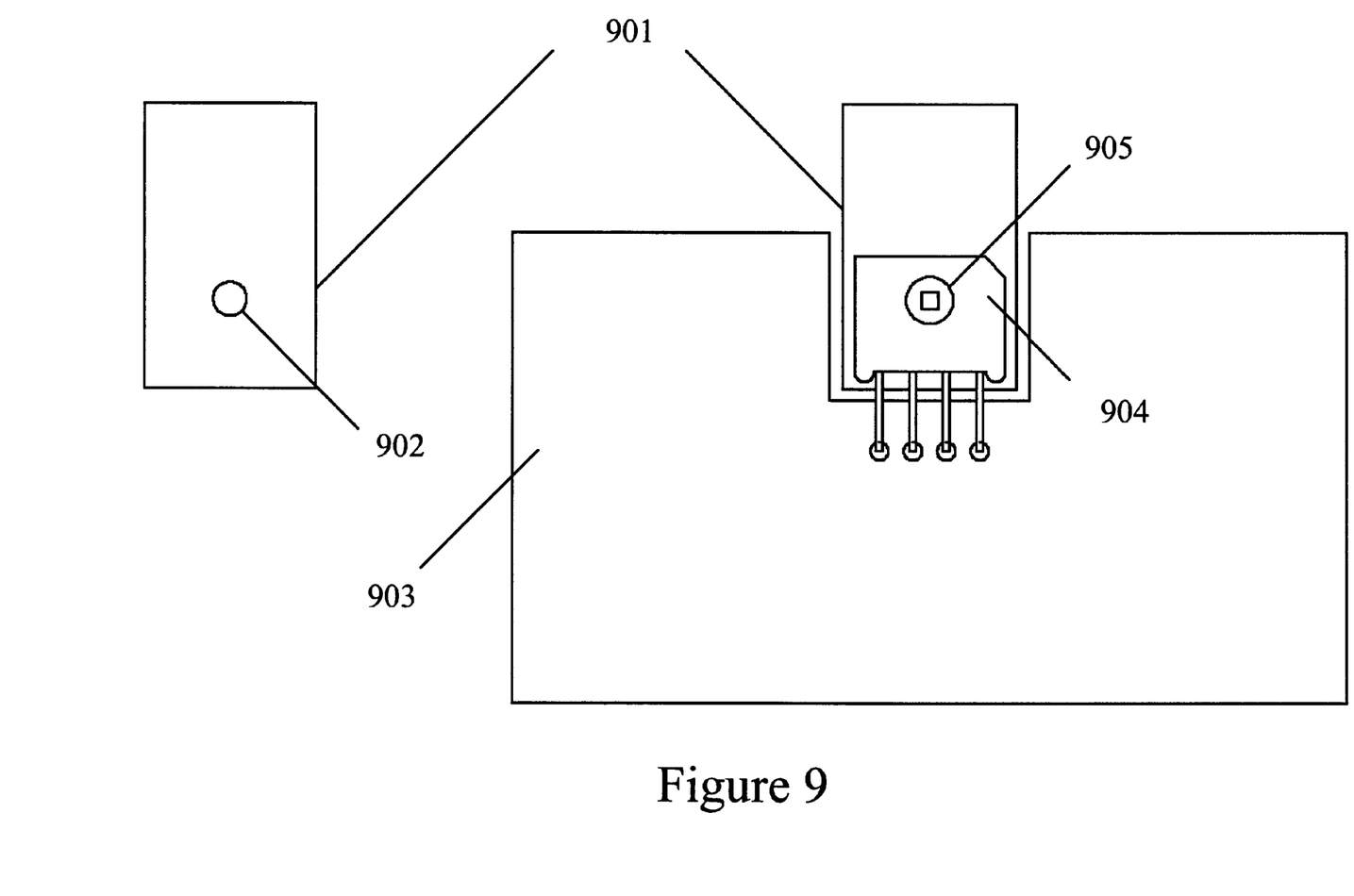
FIG. 9 shows a final assembly pictorial diagram of the present invention which corresponds to the preassembly pictorial diagram of FIG. 8.

Referring to the final assembly pictorial diagram of FIG. 9, heat sink 901 has mounting hole 902 to engage permanent fastener 905. The positioning of mounting hole 902 on heat sink 901 is related to the positioning of fixturing hole 804 on removable tab region 802 of FIG. 8. Printed circuit board 801 and power device 806 of FIG. 8 have been assembled as set forth in the flow diagram of FIG. 1, and are now assembled printed circuit board 903 and power device 904 of FIG. 9, respectively. Permanent fastener 905 affixes power device 904 of assembled printed circuit board 903 to heat sink 901 by engaging mounting hole 902.

Elevations and recessions are not used on the heat sink of FIG. 9. If it is desired to better center the power device(s) on a large heat sink, a recessed surface is preferred on same as depicted in FIG. 10, otherwise the power devices cannot have direct contact with the heat sink due to the inherent thickness of the board, or the power devices would have to be hand-mounted upside down from the rest of the board components.

Figure 10:
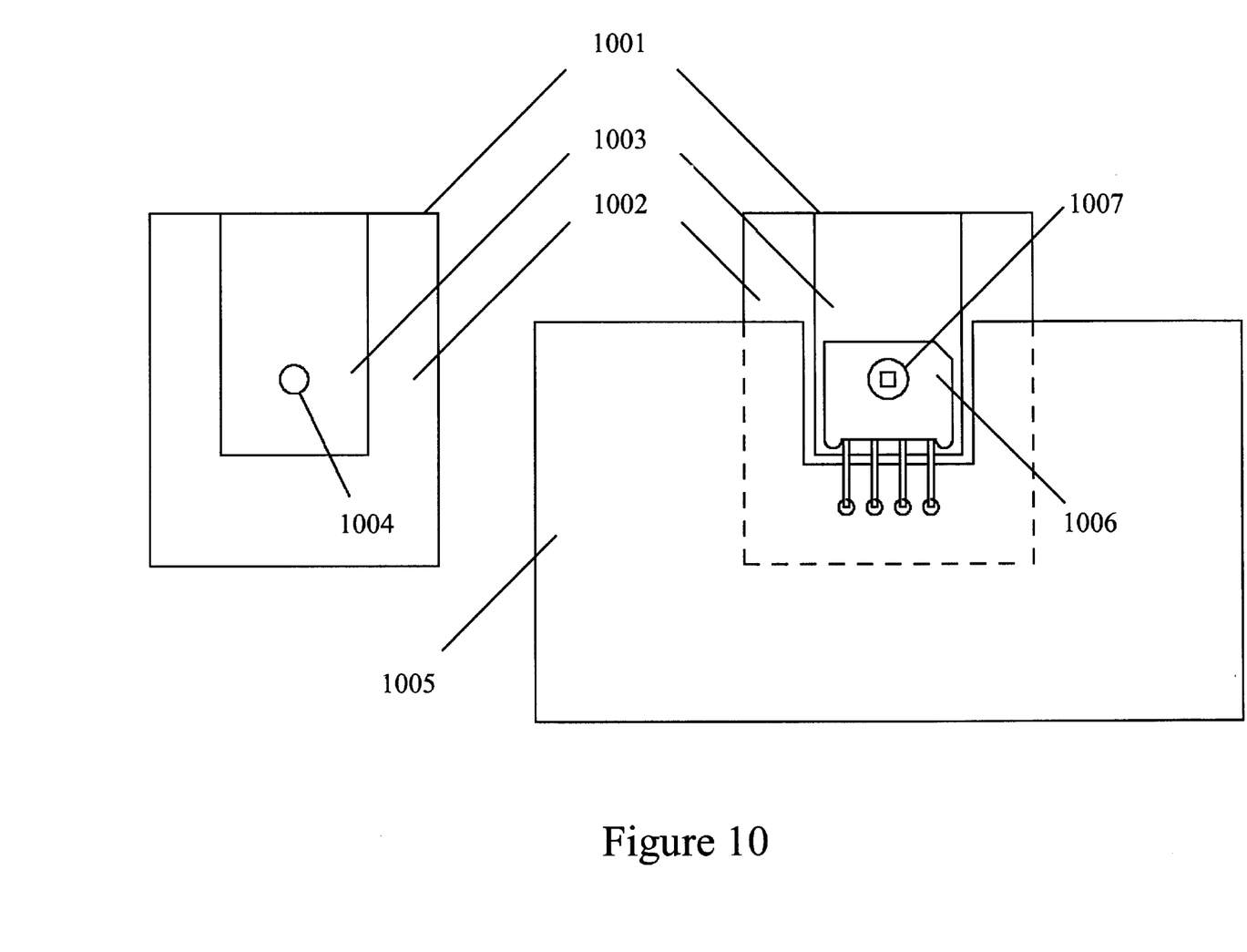
FIG. 10 shows a final assembly pictorial diagram of the present invention which corresponds to the preassembly pictorial diagram of FIG. 8 wherein the heat sink has a recessed surface.

Referring now to the final assembly pictorial diagram of FIG. 10, heat sink 1001 has recessed surface 1002, elevated surface 1003, and mounting hole 1004 located on elevated surface 1003 to engage permanent fastener 1007. The positioning of mounting hole 1004 on elevated surface 1003 is related to the positioning of fixturing hole 804 on removable tab region 802 of FIG. 8. Printed circuit board 801 and power device 806 of FIG. 8 have been assembled as set forth in the flow diagram of FIG. 1, and are now assembled printed circuit board 1005 and power device 1006 of FIG. 10, respectively. Permanent fastener 1007 affixes power device 1006 of assembled printed circuit board 1005 to elevated surface 1003 of heat sink 1001 by engaging mounting hole 1004, and, recessed surface 1002 of heat sink 1001 accommodates assembled printed circuit board 1005 by affording mechanical clearance to same.

Sometimes it is desired to surround the power device(s) on all sides with circuitry. Thus in FIG. 11, a printed circuit board of the present invention has a removable interior region located inside its perimeter.

Figure 11:
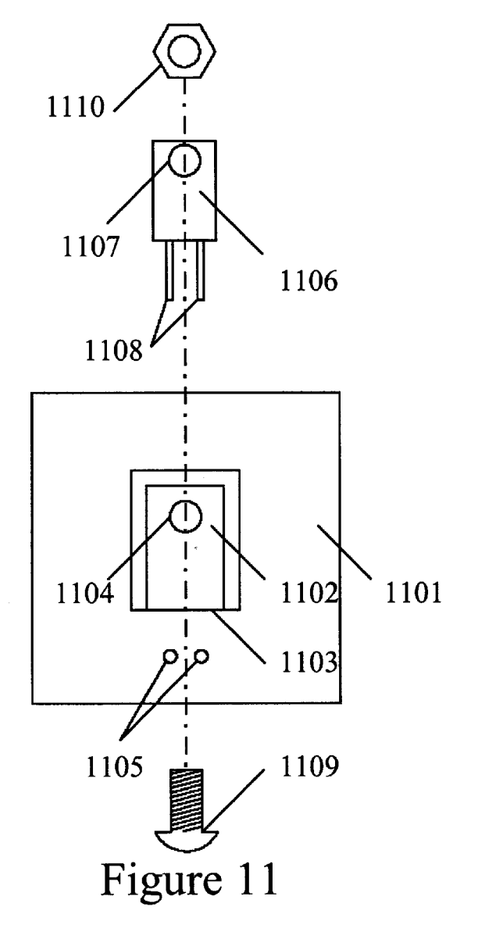
FIG. 11 shows a preassembly pictorial diagram of the present invention wherein the printed circuit board has a removable interior region.

Referring to the preassembly pictorial diagram of FIG. 11, the present invention comprises a printed circuit board 1101 having a removable interior region 1102 which is removably joined thereto by means of breakable boundary 1103. There is a fixturing hole 1104 located on removable region 1102 which accommodates temporary fastener 1109. Power device 1106 has mounting hole 1107 and electrical leads 1108. Temporary fastener 1109 is placed in fixturing hole 1104 and mounting hole 1107 and engages mating fastener 1110. Electrical holes 1105 of printed circuit board 1101 accommodate electrical leads 1108 of power device 1106.

Figure 12:
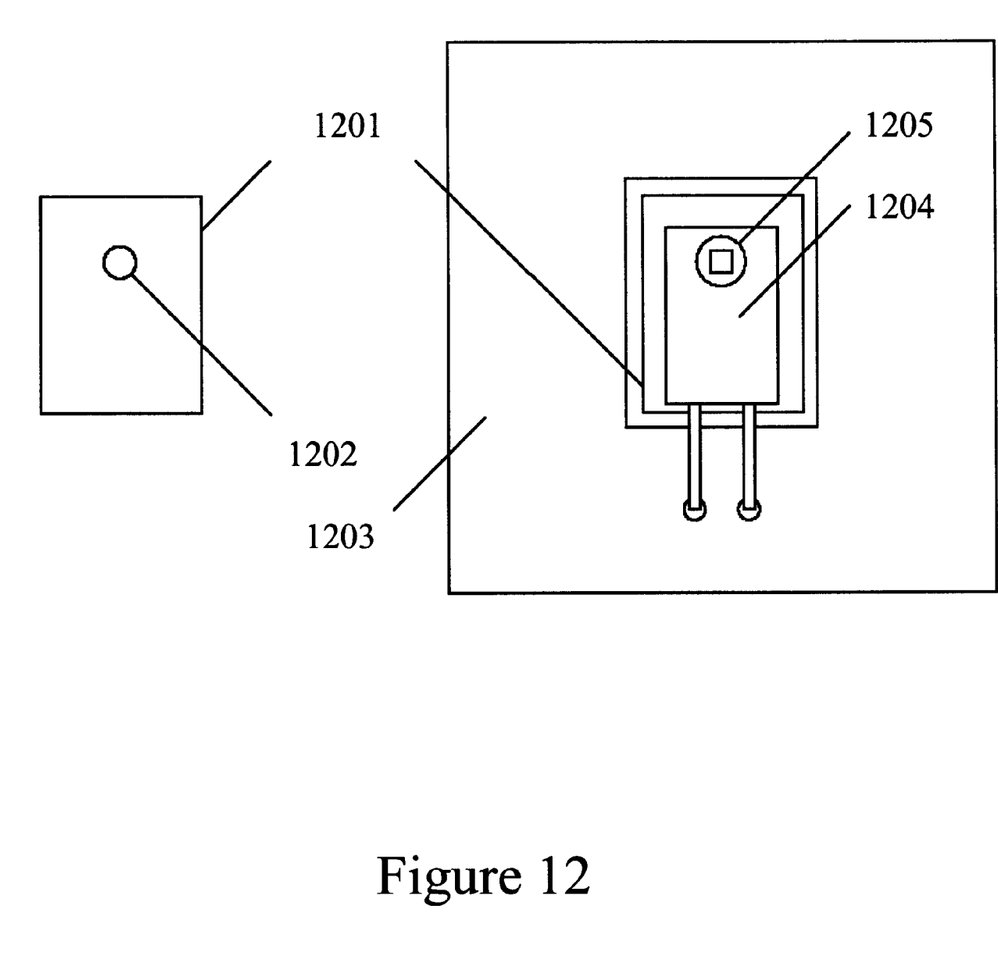
FIG. 12 shows a final assembly pictorial diagram of the present invention which corresponds to the preassembly pictorial diagram of FIG. 11; and, FIG. 13 shows a final assembly pictorial diagram of the present invention which corresponds to the preassembly pictorial diagram of FIG. 11 wherein the heat sink has a recessed surface.

Referring to the final assembly pictorial diagram of FIG. 12, heat sink 1201 has mounting hole 1202 to engage permanent fastener 1205. The positioning of mounting hole 1202 on heat sink 1201 is related to the positioning of fixturing hole 1104 on removable interior region 1102 of FIG. 11. Printed circuit board 1101 and power device 1106 of FIG. 11 have been assembled as set forth in the flow diagram of FIG. 1, and are now assembled printed circuit board 1203 and power device 1204 of FIG. 12, respectively. Permanent fastener 1205 affixes power device 1204 of assembled printed circuit board 1203 to heat sink 1201 by engaging mounting hole 1202.

Elevations and recessions are not used on the heat sink of FIG. 12. If it is desired to use a large heat sink, or to mount power devices in areas away from edges, a recessed surface is preferred on same as depicted in FIG. 13, otherwise the power devices cannot have direct contact with the heat sink due to the inherent thickness of the board, or the power devices would have to be hand-mounted upside down from the rest of the board components.

Figure 13:
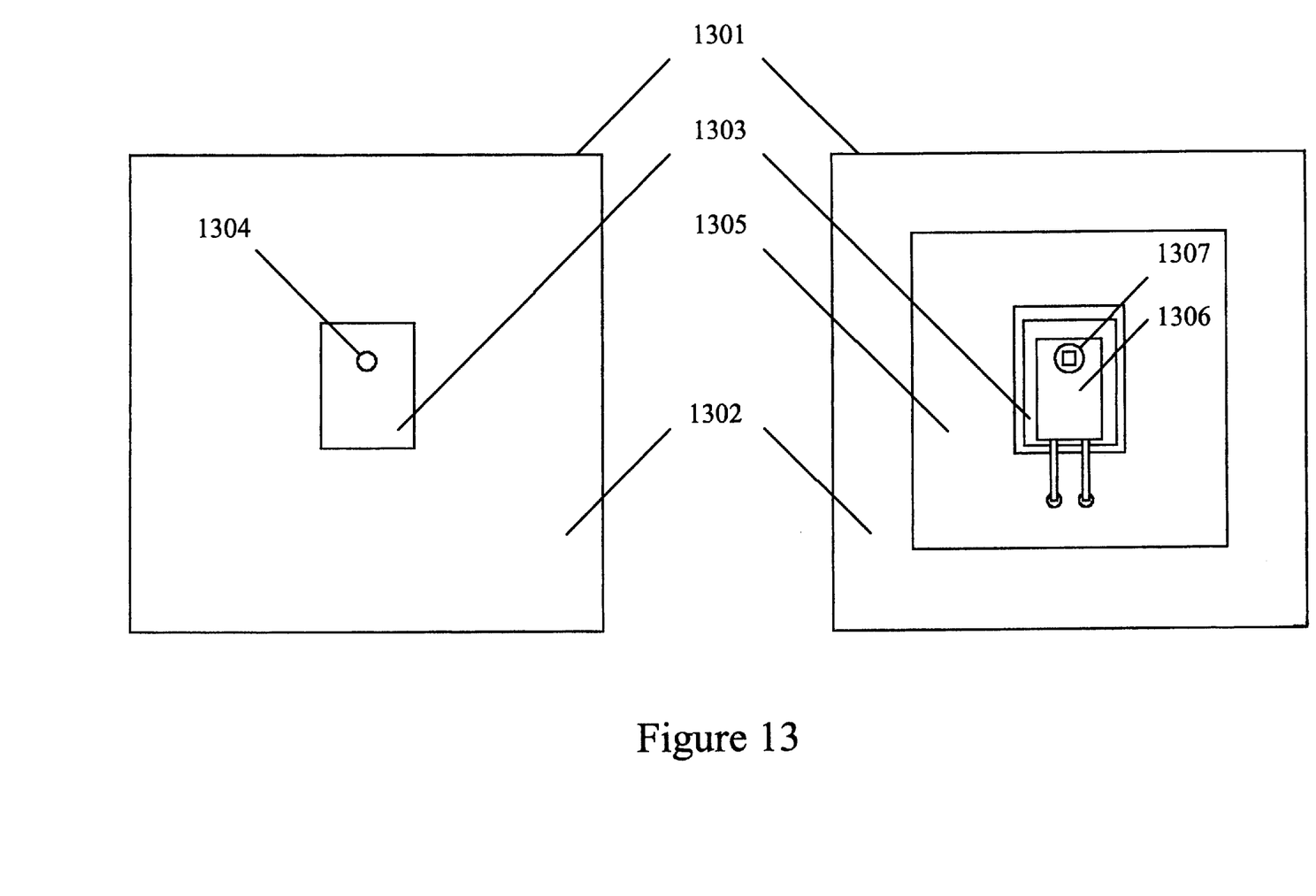

Referring now to the final assembly pictorial diagram of FIG. 13, heat sink 1301 has recessed surface 1302, elevated surface 1303, and mounting hole 1304 located on elevated surface 1303 to engage permanent fastener 1307. The positioning of mounting hole 1304 on elevated surface 1303 is related to the positioning of fixturing hole 1104 on removable interior region 1102 of FIG. 11. Printed circuit board 1101 and power device 1106 of FIG. 11 have been assembled as set forth in the flow diagram of FIG. 1, and are now assembled printed circuit board 1305 and power device 1306 of FIG. 13, respectively. Permanent fastener 1307 affixes power device 1306 of assembled printed circuit board 1305 to elevated surface 1303 of heat sink 1301 by engaging mounting hole 1304, and, recessed surface 1302 of heat sink 1301 accommodates assembled printed circuit board 1305 by affording mechanical clearance to same.

In embodiments having one power device, a printed circuit board of the present invention has one removable region. A printed circuit board of the present invention which has more than one power device has a removable region for each of said power devices, or one or more removable regions capable of fixing a plurality of power devices.

The breakable boundary of a removable region has a reduced material strength as compared to that of the adjacent printed circuit board and the removable region. Thus, when a removable region is separated from the printed circuit board, the material will fracture in a predictable and predetermined manner. Any of a number of means can be employed to cause a boundary of a removable region to be weaker than the adjacent printed circuit board material, thus facilitating separation of said removable region therefrom by reducing the force required to execute said fracture. In some embodiments of the present invention, the breakable boundary of a removable region is perforated, while in other embodiments, said breakable boundary is scored. In still other embodiments, the breakable boundary of a removable region is both perforated and scored. In other embodiments, the board may be preformed with lines of reduced material thickness at the removable regions to facilitate fracturing.

It is important that the reader be aware that a removable region of the present invention is not necessarily discarded after removal. In fact, a removable region can itself serve as another printed circuit board for use in the same electronic device or for some other purpose.

In preferred embodiments, the temporary fasteners and mating fasteners are machine screws and machine nuts composed of stainless steel, a material which resists solder adhesion and does not contaminate the wave solder.

What is claimed is:

1. An assembly procedure for assembly of a plurality of materials for a printed circuit board for a power device which includes:

(a) providing a printed circuit board and establishing at least one removable region, each of said at least one removable region being joined to a portion of said printed circuit board by means of a boundary having a reduced material strength relative to that of areas adjacent to said boundary to facilitate fracturing, establishing at least one fixturing hole for each of said at least one removable region;

(b) providing a temporary fastener and a mating fastener for each of said at least one fixturing hole;

(c) providing at least one power device;

(d) providing at least one heat sink having a mounting hole for each of said at least one fixturing hole, the position of each mounting hole on said at least one heat sink being related to the position of a corresponding fixturing hole on a removable region of said printed circuit board, and;

(e) providing at least one permanent fastener for each mounting hole for engagement therewith;

(f) affixing each of said at least one power device to a removable region of said printed circuit board using a temporary fastener and a mating fastener;

(g) performing circuitry processing on said printed circuit board, including wave soldering;

(h) removing all of said temporary fasteners and said mating fasteners and separating all of said removable regions from said printed circuit board by means of fracture, and;

(i) affixing a permanent fastener to each of said at least one power device and to said at least one heat sink by engaging a corresponding mounting hole in said at least one heat sink.

2. The assembly procedure of claim 1 wherein there is provided at least one of said at least one removable region of said printed circuit board which is a removable side region.

3. The assembly procedure of claim 1 wherein there is provided at least one of said at least one removable region of said printed circuit board which is a removable corner region.

4. The assembly procedure of claim 1 wherein there is provided at least one of said at least one removable region of said printed circuit board which is a removable tab region.

5. The assembly procedure of claim 1 wherein there is provided at least one of said at least one removable region of said printed circuit board which is a removable interior region.

6. The assembly procedure of claim 1 which further includes creating a recessed surface on said at least one heat sink which accommodates said printed circuit board after said at least one removable region has been removed.

7. The assembly procedure of claim 2 which further includes creating a recessed surface on said at least one heat sink which accommodates said printed circuit board after said at least one removable region has been removed.

8. The assembly procedure of claim 3 which further includes creating a recessed surface on said at least one heat sink which accommodates said printed circuit board after said at least one removable region has been removed.

9. The assembly procedure of claim 4 which further includes creating a recessed surface on said at least one heat sink which accommodates said printed circuit board after said at least one removable region has been removed.

10. The assembly procedure of claim 5 which further includes creating a recessed surface on said at least one heat sink which accommodates said printed circuit board after said at least one removable region has been removed.

11. An assembly of a plurality of materials for constructing a printed circuit board with a power device, which comprises:

(a) a printed circuit board having at least one removable region, each of said at least one removable region being joined to a portion of said printed circuit board by means of a boundary having a reduced material strength relative to that of areas adjacent to said boundary to facilitate fracturing, each of said at least one removable region having at least one fixturing hole;

(b) a temporary fastener and a mating fastener for each of said at least one fixturing hole;

(c) at least one power device;

(d) at least one heat sink having a mounting hole for each of said at least one fixturing hole, the position of each mounting hole on said at least one heat sink is related to the position of a corresponding fixturing hole on a removable region of said printed circuit board, and;

(e) at least one permanent fastener for each mounting hole, for engagement therewith.

12. The assembly of claim 11 wherein at least one of said at least one removable region of said printed circuit board is a removable side region.

13. The assembly of claim 11 wherein at least one of said at least one removable region of said printed circuit board is a removable corner region.

14. The assembly of claim 11 wherein at least one of said at least one removable region of said printed circuit board is a removable tab region.

15. The assembly of claim 11 wherein at least one of said at least one removable region of said printed circuit board is a removable interior region.

16. The assembly of claim 11 wherein said at least one heat sink has a recessed surface which accommodates said printed circuit board after said at least one removable region has been removed.

17. The assembly of claim 12 wherein said at least one heat sink has a recessed surface which accommodates said printed circuit board after said at least one removable region has been removed.

18. The assembly of claim 13 wherein said at least one heat sink has a recessed surface which accommodates said printed circuit board after said at least one removable region has been removed.

19. The assembly of claim 14 wherein said at least one heat sink has a recessed surface which accommodates said printed circuit board after said at least one removable region has been removed.

20. The assembly of claim 15 wherein said at least one heat sink has a recessed surface which accommodates said printed circuit board after said at least one removable region has been removed.

* * * * *